United States Patent [19]

Havel

[11] Patent Number: 4,812,744

[45] Date of Patent: Mar. 14, 1989

[54] VARIABLE COLOR ANALOG VOLTMETER

[76] Inventor: Karel Havel, P.O. Box 66, Station M, Toronto, Ontatio, Canada, M6S 4T2

[21] Appl. No.: 946,036

[22] Filed: Dec. 24, 1986

[51] Int. Cl.[4] .................. G01R 31/00; G09G 3/20
[52] U.S. Cl. ....................... 324/115; 324/96; 340/753; 340/754
[58] Field of Search ............ 324/115, 96, 122; 340/722, 753, 754

[56] References Cited

U.S. PATENT DOCUMENTS

| 3,873,979 | 3/1975 | Craford et al. | 324/96 X |
| 4,399,352 | 8/1983 | Ueda | 340/722 X |
| 4,467,323 | 8/1984 | Kling et al. | 340/722 X |
| 4,570,226 | 2/1986 | Aussedat | 340/754 X |
| 4,617,562 | 10/1966 | Klotz | 324/96 X |
| 4,688,029 | 8/1987 | Kawasaki et al. | 340/754 X |

Primary Examiner—Reinhard J. Eisenzopf
Assistant Examiner—Vinh P. Nguyen

[57] ABSTRACT

A voltmeter includes a variable color analog display for providing an analog indication of the value of a measured signal in a color in accordance with the relation of the measured value to predetermined limits.

12 Claims, 2 Drawing Sheets

VARIABLE COLOR ANALOG VOLTMETER

BACKGROUND OF THE INVENTION

1. Field of the Invention

This invention relates to measuring devices utilizing variable color analog display.

2. Description of the Prior Art

Monochromatic analog display devices for displaying information in a bar graph format are well known and extensively used. Commercially available bar display array usually consists of ten matched LEDs of the same color. Multicolor bar display arrays are also known that contain combinations of red, green and yellow LEDs arranged in a predetermined sequence. Such color sequences are fixed and cannot be changed.

It is feasible to construct a simple analog voltmeter for visually indicating the level of a measured signal by combining a monochromatic bar display array with a suitable bar or dot driver chip. Such a voltmeter, however, is capable of indicating only the measured value; it is not capable of simultaneously indicating the measured value and its relation to measurement limits.

A device for producing an illuminated band representation of measured voltage is disclosed in U.S. Pat. No. 3,961,256 issued on June 1, 1976 to Colin Simister Gaskell et al. The device relies on analog comparators for comparing the measured value with predetermined limits. When the measured value is within the limits, the band is fully illuminated, without simultaneously indicating the limits. When the measured value exceeds the limits, the portion of the band below the low limit is fully illuminated, the portion of the band between the limits is flashed on and off, to attract attention of an operator, and the portion of the band above the high limit is extinguished, to indicate the limit points, without simultaneously indicating the actual measured value.

Such a concept is not usable in a moving dot type display voltmeter wherein the value of measured voltage is indicated by the position of a single illuminated LED, because it is impossible to simultaneously fully illuminate the single LED, flash it on and off, and extinguish it.

SUMMARY OF THE INVENTION

Accordingly, it is the principal object of this invention to provide an improved analog voltmeter with a display capable of simultaneously indicating the value of a measured signal and its relation to predetermined limits.

It is another object of the invention to provide a variable color analog display voltmeter.

It is further object of the invention to provide a variable color moving dot type analog voltmeter of extremely simple construction.

In summary, an analog voltmeter of this invention includes a device for measuring an input signal and a variable color analog display for providing an analog indication of the signal. Limit color control is provided for indicating measurement limits on the display. The color of the analog indication of the input signal is controlled in accordance with the relation of the signal to the limits.

Further objects of the invention will become obvious from the accompanying drawings and their description.

BRIEF DESCRIPTION OF THE DRAWINGS

In the drawings in which is shown the preferred embodiment of the invention.

Throughout the drawings, like characters indicate like parts.

DESCRIPTION OF THE PREFERRED EMBODIMENT

Figures 1A, 1B, 1C, 1D, 1E:
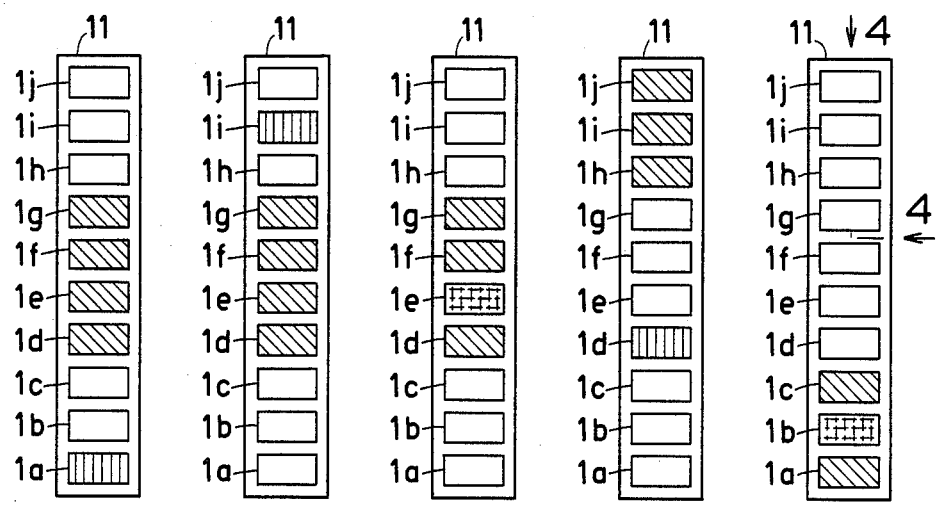
FIGS. 1a to 1e are examples of a variable color bar graph display on which measured values and limits are simultaneously indicated.

Referring now, more particularly, to the drawings, in FIGS. 1a to 1e are shown examples of a variable color bar graph display on which are indicated five different combinations of a measured value and limits. Considering the full scale to be 10 Volts, each display element in bar graph display 11 represents 1 Volt step. Thus display element 1a represents 1 Volt, display element 1b represents 2 Volts, display element 1c represents 3 Volts, etc. It would be obvious that the illustrated display may represent other scales of other quantities.

By referring to several illustrated examples, FIG. 1a simultaneously exhibits acceptable measurement field from low limit 4 Volts to high limit 7 Volts, by illuminating display elements 1d, 1e, 1f, and 1g in green color, and measured value 1 Volt (below the low limit), by illuminating display element 1a in red color. The remaining display elements 1b, 1c, 1h, 1i, and 1j are extinguished. The red color of the measured value indicates that it does not lie within the limits.

FIG. 1b exhibits the same limits and measured value 9 Volts (above the high limit), by illuminating display element 1i in red color, to indicate that the measured value does not lie within the limits.

FIG. 1c exhibits the same limits and measured value 5 Volts, by illuminating display element 1e in yellow color, to indicate that the measured value lies within the bounds of the limits.

FIG. 1d exhibits only a low measurement limit 8 Volts (thereby indicating that all higher values are acceptable), by illuminating display elements 1h, 1i, and 1j in green color, and measured value 4 Volts, by illuminating display element 1d in red color, to indicate that the measured value is not acceptable (not higher that the low limit).

FIG. 1e exhibits only a high measurement limit 3 Volts (thereby indicating that all lower values are acceptable), by illuminating display elements 1a and 1c in green color, and measured value 2 Volts, by illuminating display element 1b in yellow color, to indicate that the measured value is acceptable (lower that the high limit).

Figure 2:
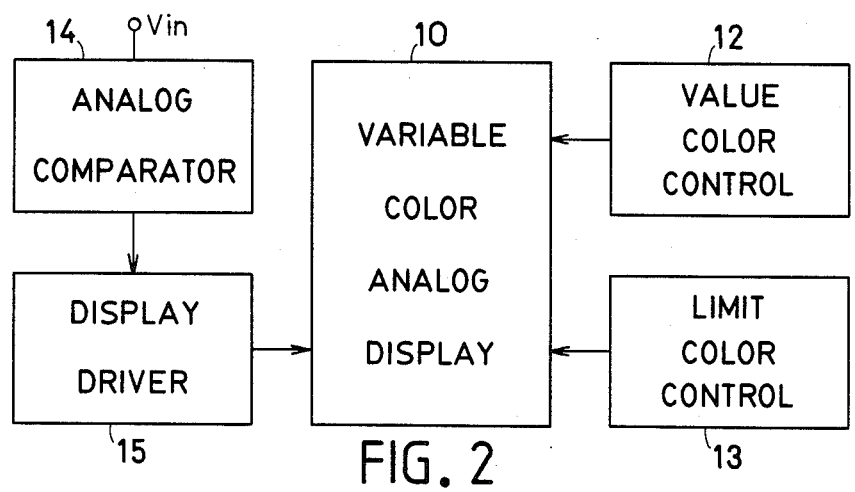
FIG. 2 is a block diagram of a variable color analog display voltmeter.

In FIG. 2 is shown a block diagram of a variable color analog voltmeter of the invention which includes an analog comparator 14, for comparing input signal Vin with reference values, and a display driver 15, for causing an analog indication of the input signal to be exhibited on a variable color analog display 10, in a manner well understood by those skilled in the art. The invention resides in the addition of a limit color control 13, for causing measurement limits to be exhibited on the display 10 in a desired color, and a value color control 12, for controlling the color of the exhibited analog indication in accordance with its relation to the limits. The analog voltmeter of the invention is thus capable of simultaneously exhibiting measured value, by analog indication, and its relation to predetermined limits, by color.

Figure 3:
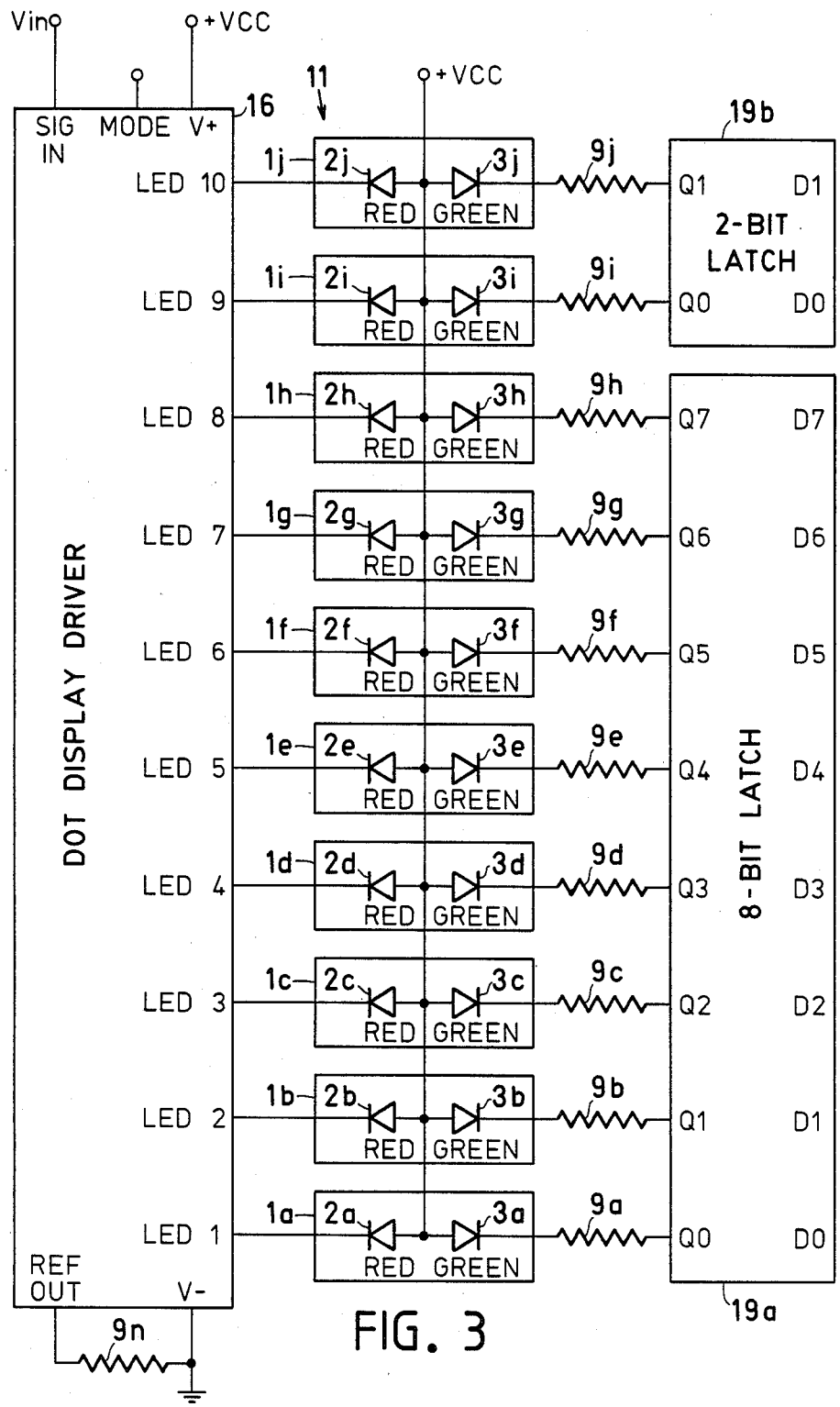
FIG. 3 is a simplified schematic diagram of a variable color moving dot type voltmeter.

Proceeding now to the detailed description, in FIG. 3 is shown a simplified schematic diagram of a variable color bar graph voltmeter of the invention. The circuit employs a commercially available dot display driver 16 which contains a string of voltage comparators combined with a voltage reference network for detecting the level of an input signal Vin, applied to its input SIG IN, and for accordingly developing output drive signals to illuminate the appropriate display element for providing a linear analog indication of the level of the input signal. The voltmeter operates in a moving dot mode, which is achieved by leaving its MODE input open. The value of resistor 9n coupled to reference output pin REF OUT determines the LED current and therefore the brightness of the display.

Each display element of bar graph display device 11 includes a pair of closely adjacent LEDs (light emitting diodes): a red LED 2 and green LED 3 which are adapted for producing a composite light signal of a variable color. The cathodes of all red LEDs 2a, 2b, 2c, 2d, 2e, 2f, 2g, 2h, 2i, and 2j are respectively coupled to the outputs LED 1, LED 2, LED 3, LED 4, LED 5, LED 6, LED 7, LED 8, LED 9, and LED 10 of dot display driver 16. The cathodes of all green LEDs 3a, 3b, 3c, 3d, 3e, 3f, 3g, 3h, 3i, and 3j are respectively coupled, via current limiting resistors 9a, 9b, 9c, 9b, 9e, 9f, 9g, and 9h, to the outputs Q0, Q1, Q2, Q3, Q4, Q5, Q6, and Q7 of an 8-bit latch 19a and, via current limiting resistors 9i and 9j, to the ouputs Q0 and Q1 of a 2-bit latch 19b. The anodes of all red LEDs 2a to 2j and all green LEDs 3a to 3j are commonly coupled to a power source +VCC. Data representing predetermined low and high measurement limits, defining the acceptable measurement field, may be stored in latches 19a, 19b by presenting the data to their inputs D0 to D7 and by activating their latching inputs (not shown).

The operation of the analog voltmeter will be explained on several examples. Example 1a considers low measurement limit 4 Volts and high measurement limit 7 Volts. Data representing such limits may be stored in latches 19a, 19b by applying a low logic level to inputs D3, D4, D5, an D6 of latch 19a, and by applying a high logic level to all remaining inputs D0, D1, D2, D7 of latch 19a and D0, D1 of latch 19b, and by activating latching inputs. As a result, outputs Q3, Q4, Q5, and Q6 drop to a low logic level. The current flows from the source +VCC, via green LED 3d and current limiting resistor 9d to output Q3, via green LED 3e and resistor 9e to output Q4, via green LED 3f and resistor 9f to output Q5, and via green LED 3g and resistor 9g to output Q6. As a consequence, green LEDs 3d, 3e, 3f, and 3g illuminate. The remaining green LEDs are extinguished because the remaining outputs of the latches are at a high logic level. Considering the measured value of the input signal to be about 1 Volt, dot display driver 16 develops a low level at its output LED 1. The current flows from the source +VCC via red LED 2a to the output LED 1. As a result, red LED 2a illuminates. The overall effect is that display elements 1d, 1e, 1f, and 1g illuminate in green color, to indicate acceptable measurement field from 4 Volts to 7 Volts, and display element 1a illuminates in red color, to simultaneously indicate measured value of the input signal (about 1 Volt), by position, and its relation to the limits, by red color (meaning that it does not lie within the bounds of the limits), as viewed in FIG. 1a.

EXAMPLE 1b considers the same measurement limits and measured value about 9 Volts. Dot display driver 16 develops in such case a low level at its output LED 9. The current flows from the source +VCC via red LED 2i to the output LED 9 to cause red LED 2i to illuminate. The overall effect is that display elements 1d, 1e, 1f, and 1g illuminate in green color, to indicate acceptable measurement field from 4 Volts to 7 Volts, and display element 1i illuminates in red color, to indicate that the measured value 9 Volts does not lie within the bounds of the limits, as viewed in FIG. 1b.

EXAMPLE 1c considers the same measurement limits and measured value about 5 Volts. Dot display driver 16 develops in such case a low level at its output LED 5. The current flows from the source +VCC via red LED 2e to the output LED 5 to cause red LED 2e to illuminate. As a result of internal blending of light signals emitted by green LED 3e and red LED 2e, the display element 1e illuminates in substantially yellow color. The overall effect is that display elements 1d, 1f, and 1g illuminate in green color, to indicate acceptable measurement field from 4 Volts to 7 Volts, and display element 1e illuminates in yellow color, to indicate that the measured value 5 Volts lies within the bounds of the limits, as viewed in FIG. 1c.

EXAMPLE 1d considers only a low measurement limit 8 Volts, thereby indicating that all higher measured values are acceptable. Data representing such limit stored in latches 19a, 19b cause outputs Q7 of latch 19a and Q0, Q1 of latch 19b to drop to a low logic level. The current flows from the source +VCC, via green LED 3h and resistor 9h to output Q7 of latch 19a, via green LED 3i and resistor 9i to output Q0 of latch 19b, and via green LED 3j and resistor 9j to output Q1 of latch 19b. As a consequence, green LEDs 3h, 3i, 3j illuminate. The remaining green LEDs are extinguished because the remaining outputs of latch 19a are at a high logic level. Considering the measured value to be about 4 Volt, dot display driver 16 develops a low level at its output LED 4. The current flows from the source +VCC via red LED 2d to the output LED 4 to cause red LED 2d to illuminate. The overall effect is that display elements 1h, 1i, and 1j illuminate in green color, to indicate acceptable measurement field from 8 Volts to 10 Volts, and display element 1d illuminates in red color, to indicate that the measured value 4 Volts does not lie within the acceptable field, as viewed in FIG. 1d.

EXAMPLE 1e considers only high measurement limit 3 Volts, thereby indicating that all lower measured values are acceptable. Data representing such limit stored in latches 19a, 19b cause outputs Q0, Q1, and Q2 of latch 19a to drop to a low logic level. The current flows from the source +VCC, via green LED 3a and resistor 9a to output Q0, via green LED 3b and resistor 9b to output Q1, and via green LED 3c and resistor 9c to output Q2. As a consequence, green LEDs 3a, 3b, and 3c illuminate. The remaining green LEDs are extinguished because the remaining output of the latches are at a high logic level. Considering the measured value to be about 2 Volts, dot display driver 16 develops a low level at its output LED 2. The current flows from the source +VCC via red LED 2b to the output LED 2 to cause red LED 2b to illuminate. As a result of internal blending of light signals emitted by green LED 3b and red LED 2b, the display element 1b illuminates in substantially yellow color. The overall effect is that display elements 1a and 1c illuminate in green color, to indicate acceptable measurement field from 1 Volt to 3 Volts, and display element 1b illuminates in yellow color, to indicate that the measured value 2 Volts lies within the acceptable field, as viewed in FIG. 1e.

The color of the composite light signal may be adjusted by changing the value of resistor 9n in relation to the values of current limiting resistors 9a to 9j.

Figure 4:
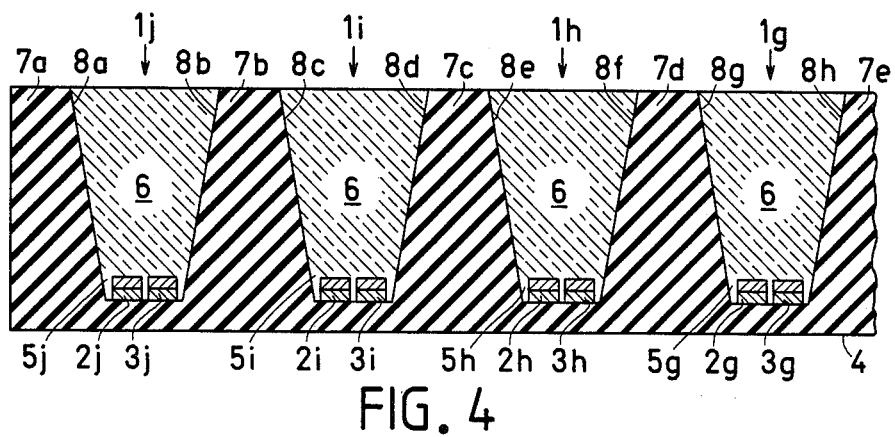
FIG. 4 is a cross-sectional view, taken along the line 4—4 in FIG. 1e, revealing internal structure of a portion of variable color bar graph display device.

An important consideration has been given to physical arrangement of the light emitting diodes in the display elements, as illustrated in FIG. 4. In the display element 1j, red LED 2j and green LED 3j are disposed on a support 4 in a light blending ycavity 5j and are completely surrounded by transparent light scattering material 6. When forwardly biased, the LEDs 2j and 3j emit light signals of red and green colors, respectively, which are blended by passing through light scattering material 6, acting to disperse the light signals, to form a composite light signal that emerges at the upper surface of the display element 1j. The color of the composite light signal may be controlled by varying the portions of red and green light signals. In the display element 1i, red LED 2i and green LED 3i are similarly disposed in a light blending cavity 5i and may be similarly activated. In a similar fashion, red LED 2h and green LED 3h are disposed in a light blending cavity 5h, and red LED 2g and green LED 3g are disposed in a light blending cavity 5g.

The display elements 1j to 1g are optically separated from one another by opaque walls 7. Although not shown, it will be appreciated that the remaining display elements are similarly optically separated. In the display element 1j, the walls 7a and 7b have generally smooth inclined surfaces 8a and 8b defining an obtuse angle with the support 4 and defining a light blending cavity 5j therebetween. In the display element 1i, the inclined surfaces 8c and 8d of the walls 7b and 7c similarly define a light blending cavity 5i therebetween. In a similar fashion, the light blending cavity 5h is defined by inclined surfaces 8e and 8f of the walls 7c and 7d, and light blending cavity 5g is defined by inclined surfaces 8g and 8h of the walls 7d and 7e. Although the walls and light blending cavities are shown to be of certain shapes and dimensions, it is envisioned that they may be modified and rearranged.

The invention may be now briefly summarized. The method was disclosed of simultaneously indicating a measured value and its relation to a predetermined limit, on a single variable color analog display, by causing an analog indication of the measured value to be exhibited on the display and by controlling the color of the indication in accordance with the relation of the measured value to the limit.

A variable color analog voltmeter was disclosed that comprises a signal measuring device, variable color analog display for providing an analog indication of the signal, and color control for controlling the color of the analog indication in accordance with the relation of the measured signal to a low and high predetermined limits. The field between the limits may be also exhibited on the display in a different color.

All matter herein described and illustrated in the accompanying drawings should be interpreted as illustrative and not in a limiting sense. It would be obvious that numerous modifications can be made in the construction of the preferred embodiment shown herein, without departing from the spirit of the invention as defined in the appended claims. It is contemplated that the principles of the invention may be also applied to numerous diverse types of display devices, such are liquid crystal, plasma devices, and the like.

CORRELATION TABLE

This is a correlation table of reference characters used in the drawings herein, their descriptions, and examples of commercially available parts.

| # | DESCRIPTION | EXAMPLE |
|---|---|---|
| 1 | display element | |
| 2 | red LED | |
| 3 | green LED | |
| 4 | support | |
| 5 | light blending cavity | |
| 6 | light scattering material | |
| 7 | opaque wall | |
| 8 | inclined surface of wall | |
| 9 | resistor | |
| 10 | variable color analog display | |
| 11 | variable color bar graph display | |
| 12 | value color control | |
| 13 | limit color control | |
| 14 | analog comparator | |
| 15 | display driver | |
| 16 | dot display driver | LM3914 |
| 19 | 8-bit latch | 74F373 |

What I claim is:

1. A method of simultaneously indicating a measured value of a signal, a predetermined limit, and the relation of said value of the signal to said limit, on a single variable color analog display means, by causing said limit to be exhibited on said display means in a first color and by causing an analog indication of said value of the signal to be exhibited on said display means either in a second or in a third color in accordance with the relation of said value of the signal to said limit, said first, second, and third colors being respectively different.

2. A measuring device comprising:
signal measuring means;
variable color analog display means for providing an analog indication of a measured value of the signal;
means for exhibiting a predetermined limit on said display means in a first color; and
color control means for illuminating said analog indication either in a second or in a third color in accordance with the relation of said value of the signal to said limit, said first, second, and third colors being respectively different.

3. A measuring device comprising:
signal measuring means;
variable color analog display means for providing an analog indication of a measured value of the signal;
means for exhibiting predetermined low and high limits, defining an acceptable measurement field, on said display means in a first color; and
color control means for illuminating said analog indication either in a second color when said value of the signal does not lie within the bounds of said low and high limits or in a third color when said value of the signal lies within the bounds of said low and high limits, said first, second, and third colors being respectively different.

4. A measuring device as defined in claim 3 wherein said third color is obtained by blending said first and second colors.

5. A measuring device comprising:
  signal measuring means;
  analog display means including a plurality of variable color display elements arranged in an array, each said display element including a first light source for emitting upon activation light signals of a first primary color, second light source for emitting upon activation light signals of a second primary color, and means for combining said light signals in each said display element to obtain a composite light signal of a composite color;
  value control means for providing on said display means an analog indication of a measured value of the signal by selectively activating a single one of said first light sources corresponding by a position in said array to said value of the signal, for illuminating it in said first primary color;
  memory means for storing data representing values of predetermined low and high limits;
  limit control means responsive to said memory means for selectively activating certain of said second light sources corresponding by positions in said array to a field between said low and high limits, for illuminating said field in said second primary color;
  whereby said analog indication is illuminated either in said first primary color when said value of the signal does not lie within the bounds of said low and high limits or in said composite color when said value of the signal lies within the bounds of said low and high limits.

6. A measuring device comprising:
  signal measuring means;
  variable color analog display means for providing an analog indication of a measured value of the signal;
  memory means for storing data representing the value of a limit, said memory means having a memory output indicative of the value of the stored data;
  limit color control means responsive to said memory output for selectively exhibiting the value of said limit on said display means in a first color; and
  value color control means for illuminating said analog indication either in a second or in a third color in accordance with the relation of said value of the signal to said limit, said first, second, and third colors being respectively different.

7. A measuring device comprising:
  signal measuring means;
  variable color analog display means for providing an analog indication of a measured value of the signal;
  memory means for storing data representing a field between predetermined low and high limits, said memory means having memory outputs indicative of the values of the stored data;
  limit color control means responsive to said memory outputs for selectively exhibiting said field on said display means in a first color; and
  value color control means for illuminating said analog indication either in a second or in a third color in accordance with the relation of said value of the signal to said field, said first, second, and third colors being respectively different.

8. A measuring device comprising:
  signal measuring means;
  analog display means including a plurality of side by side positioned variable color display elements;
  value control means for selectively illuminating a single one of said display elements corresponding by its position to a measured value of the signal; and
  color control means for controlling the color of the illuminated display element in accordance with the relation of said value of the signal to a predetermined limit.

9. A method of simultaneously indicating a measured value of a signal, a predetermined limit, and the relation of said value of the signal to said limit, on a single analog display means including a plurality of side by side positioned variable color display elements, by illuminating in a first color a single one of said display elements corresponding by its position to the value of said limit, and by illuminating either in a second or in a third color a selective one of said display elements corresponding by its position to said value of the signal, in accordance with the relation of said value of the signal to said limit, said first, second, and third colors being respectively different.

10. A measuring device comprising:
  signal measuring means;
  analog display means including a plurality of side by side positioned variable color display elements;
  limit control means for selectively illuminating in a first color a single one of said display elements corresponding by its position to the value of a predetermined limit; and
  value color control means for selectively illuminating either in a second color or in a third color a single one of said display elements corresponding by its position to a measured value of the signal, in accordance with the relation of said value of the signal to said limit, said first, second, and third colors being respectively different.

11. A measuring device comprising:
  signal measuring means;
  analog display means including a plurality of side by side positioned variable color display elements;
  limit control means for selectively illuminating in a first color a first one of said display elements, corresponding by its position to the value of a predetermined low limit, and a second one of said display elements, corresponding by its position to a predetermined high limit; and
  value color control means for selectively illuminating a single one of said display elements corresponding by its position to a measured value of the signal either in a second color when said value of the signal does not lie within the bounds of said low limit and said high limit or in a third color when said value of the signal lies within the bounds of said low limit and said high limit, said first, second, and third colors being respectively different.

12. A measuring device comprising:
  signal measuring means;
  analog display means including a plurality of side by side positioned variable color display elements;
  limit control means for selectively illuminating in a first color certain of said display elements corresponding by their positions to a field between a predetermined low limit and a predetermined high limit; and
  value color control means for selectively illuminating a single one of said display elements corresponding by its position to a measured value of the signal either in a second color when said value of the signal does not lie within said field or in a third color when said value of the signal lies within said field, said first, second, and third colors being respectively different.

* * * * *